(12) United States Patent
Choi et al.

(10) Patent No.: US 8,624,665 B2
(45) Date of Patent: Jan. 7, 2014

(54) METHOD OF OPERATING SEMICONDUCTOR DEVICE

(75) Inventors: Sang-moo Choi, Yongin-si (KR); Won-joo Kim, Hwaseong-si (KR); Tae-hee Lee, Yongin-si (KR); Dae-kil Cha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 759 days.

(21) Appl. No.: 12/462,176

(22) Filed: Jul. 30, 2009

(65) Prior Publication Data

US 2010/0097124 A1   Apr. 22, 2010

(30) Foreign Application Priority Data

Oct. 21, 2008   (KR) .................. 10-2008-0103201

(51) Int. Cl.
*H03K 3/01*   (2006.01)

(52) U.S. Cl.
USPC ............. 327/534; 257/66; 257/347; 257/349; 365/149; 365/177; 365/182; 365/189.16; 365/190; 365/222; 365/230.03

(58) Field of Classification Search
USPC ............................ 365/168, 177, 182, 189.11
See application file for complete search history.

(56) References Cited

U.S. PATENT DOCUMENTS

| | | | |
|---|---|---|---|
| 6,903,384 B2 | 6/2005 | Hsu et al. | |
| 6,913,964 B2 * | 7/2005 | Hsu | 438/239 |
| 7,301,803 B2 * | 11/2007 | Okhonin et al. | 365/177 |
| 7,924,630 B2 * | 4/2011 | Carman | 365/189.04 |
| 7,990,779 B2 * | 8/2011 | Choi et al. | 365/189.11 |
| 7,990,794 B2 * | 8/2011 | Choi et al. | 365/218 |
| 2005/0063224 A1 * | 3/2005 | Fazan et al. | 365/177 |
| 2006/0131650 A1 | 6/2006 | Okhonin et al. | |
| 2007/0058427 A1 * | 3/2007 | Okhonin et al. | 365/177 |
| 2007/0187775 A1 * | 8/2007 | Okhonin et al. | 257/370 |
| 2008/0025083 A1 | 1/2008 | Okhonin et al. | |
| 2008/0048239 A1 | 2/2008 | Huo et al. | |
| 2008/0099811 A1 * | 5/2008 | Tak et al. | 257/297 |
| 2010/0034041 A1 * | 2/2010 | Widjaja | 365/222 |
| 2010/0085806 A1 * | 4/2010 | Wang et al. | 365/182 |
| 2010/0091586 A1 * | 4/2010 | Carman | 365/189.011 |
| 2010/0118623 A1 * | 5/2010 | Choi et al. | 365/189.11 |

FOREIGN PATENT DOCUMENTS

| | | |
|---|---|---|
| KR | 10-2007-0091299 | 9/2007 |
| KR | 10-2008-0018040 | 2/2008 |

* cited by examiner

*Primary Examiner* — Matthew W Such
*Assistant Examiner* — David Spalla
(74) *Attorney, Agent, or Firm* — Onello & Mello, LLP

(57) ABSTRACT

Provided is a method of operating a semiconductor device, wherein an operating mode is set by adjusting timing of a voltage pulse or by adjusting a voltage level of the voltage pulse.

18 Claims, 7 Drawing Sheets

METHOD OF OPERATING SEMICONDUCTOR DEVICE

CROSS-REFERENCE TO RELATED APPLICATIONS

This application claims the benefit of Korean Patent Application No. 10-2008-0103201, filed on Oct. 21, 2008, in the Korean Intellectual Property Office, the disclosure of which is incorporated herein in its entirety by reference.

FIELD OF INVENTION

The inventive concept relates to a method of operating a semiconductor device, and more particularly, to a method of operating a semiconductor device by which an operating mode is set by adjusting the timing of a voltage pulse or by adjusting a voltage level of the voltage pulse.

BACKGROUND

Single transistor (1-T) dynamic random access memory (DRAM) devices, are a capacitor-less memory that have been recently used in a variety of applications. Also, 1-T DRAM devices may be fabricated by using a relatively simple fabrication process and have an improved sensing margin. 1-T DRAM is also sometimes referred to as "Z-RAM," which is short for "zero capacitor RAM."

1-T DRAM offers performance similar to the standard six-transistor SRAM (Static RAM) cell used in cache memory, but since it uses only a single transistor it offers much higher densities. It is also denser than conventional one-transistor, one-capacitor DRAM used for the majority of a modern computer's main memory.

1-T DRAM relies on an effect known as the floating body effect, which was first encountered in CPU design based on the silicon-on-insulator (SOI) process introduced in the early 2000s. This effect causes capacitance to form between the transistor and the underlying insulating substrate, which was seen as a problem that needed to be solved in conventional designs. The same effect, however, allows a DRAM-like cell to be built using the transistor only, the floating body effect taking the place of the conventional capacitor. Consisting of only one part instead of two, 1-T DRAM offers twice the density of DRAM, and five times that of SRAM.

1-T DRAM also uses small cell size leads, which causes 1-T DRAM to be faster than even SRAM, with SRAM normally much faster than DRAM. SRAM's large cell size means that any "reasonable" amount of SRAM cache takes up a large portion of the CPU die. The long traces needed to carry current into the cells have a capacitance of their own, and requires the driver circuitry to "slow down" in order to allow the charge to settle. Although 1-T DRAM's individual cells are not as fast as SRAM, the lack of the long lines allows a similar amount of cache to be run at roughly the same data rates by avoiding this delay while taking up less space.

Despite the utility of 1-T DRAM devices, production has posed unique challenges and methods of operating such semiconductor devices have been limited, particularly with respect to setting an operating mode.

SUMMARY

The inventive concept provides a method of operating a semiconductor device by which an operating mode is set by adjusting the timing of a voltage pulse. The inventive concept also provides a method of operating a semiconductor device by which an operating mode is set by adjusting a voltage level of a voltage pulse.

According to an aspect of the inventive concept, there is provided a method of operating at least one semiconductor device comprising a drain region, a source region, a floating body region, and a gate region. The method includes, in an erase mode in which a state of data of the semiconductor device is changed into a first state, a drain voltage pulse applied to the drain region is transitioned to a standby state from an enable state and then, a gate voltage pulse applied to the gate region is transitioned to the standby state from the enable state. And in a write mode in which a state of data of the semiconductor device is changed into a second state, the gate voltage pulse is transitioned to the standby state from the enable state and then, the drain voltage pulse is transitioned to the standby state from the enable state.

The can further comprise, in the erase mode, transitioning the drain voltage pulse to the standby state from the enable state and then, transitioning the gate voltage pulse to the standby state from the enable state, wherein a transition time of the drain voltage pulse may be the same as a transition time of the gate voltage pulse.

In the erase mode and the write mode, a source voltage applied to the source region may be one of a source voltage pulse or a voltage that has a predetermined voltage level.

In the erase mode and the write mode, a time in which the gate voltage pulse is transitioned to the enable state from the standby state, may be faster than, the same as or slower than a time in which the drain voltage pulse is transitioned to the enable state from the standby state.

An amplitude of the gate voltage pulse in the erase mode may be the same as an amplitude of the gate voltage pulse in the write mode, or an amplitude of the drain voltage pulse in the erase mode may be the same as an amplitude of the drain voltage pulse in the write mode.

The method can include applying a source voltage to the source region in the form of a source voltage pulse or a source voltage having a predetermined level, and in the erase mode: an amplitude of the gate voltage pulse is different from an amplitude of the source voltage pulse, or an amplitude of the gate voltage pulse is different from the predetermined voltage level of the source voltage.

In the erase mode and the write mode, a time in which the gate voltage pulse is transitioned to the enable state from the standby state, can be faster than, the same as, or slower than a time in which the drain voltage pulse is transitioned to the enable state from the standby state.

In the erase mode and the write mode, a duration time of the gate voltage pulse may be narrower than, the same as, or wider than a duration time of the drain voltage pulse.

In the erase mode and the write mode, a voltage level in an enable state can be reduced in a sequence of the drain voltage pulse, the source voltage, and the gate voltage pulse or in a sequence of the drain voltage pulse, the gate voltage pulse, and the source voltage.

In the erase mode and the write mode, a voltage level of the drain voltage pulse in a standby state can be the same as a voltage level of the source voltage, and a voltage level of the gate voltage pulse in a standby state can be lower than a voltage level of the source voltage.

A voltage level of the gate voltage pulse in an enable state can be larger than a voltage level of the gate voltage pulse in a standby state.

The semiconductor device may comprise a semiconductor substrate; a body region positioned on the semiconductor substrate; a plurality of gate patterns positioned on the semiconductor substrate and disposed at both sides of the body region; and first and second impurity-doped regions positioned above the body region.

The gate patterns can be separated from the first and second impurity-doped regions in a vertical direction by a predetermined distance so that the gate patterns do not overlap with the first and second impurity-doped regions.

The semiconductor device may comprise a semiconductor substrate; a gate pattern positioned on the semiconductor substrate; a body region positioned on the gate pattern; and first and second impurity-doped regions positioned above the body region.

According to another aspect of the inventive concept, there is provided a method of operating at least one semiconductor device comprising a drain region, a source region, a floating body region, and a gate region. The method includes applying a voltage level of a gate voltage pulse to the gate region in an erase mode, in which a state of data of the semiconductor device is changed into a first state, that is higher than a voltage level of the gate voltage pulse in a write mode, in which a state of data of the semiconductor device is changed into a second state. The method also includes applying a voltage level of a source voltage pulse to the source region in the erase mode that is higher than a voltage level of the source voltage pulse in the write mode.

A voltage level of the gate voltage pulse in an enable state can be higher than a voltage level of the gate voltage pulse in a standby state. A voltage level of the source voltage pulse in an enable state can be lower than a voltage level of the source voltage pulse in a standby state. And in the erase mode and the write mode, a voltage level of the gate voltage pulse in an enable state can be the same as a voltage level of the source voltage pulse in an enable state.

In the write mode, a voltage level of the gate voltage pulse in an enable state and a voltage level of the source voltage pulse in an enable state can be lower than a ground voltage level. And in the erase mode, a voltage level of the gate voltage pulse in an enable state and a voltage level of the source voltage pulse in an enable state can be the same as the ground voltage level.

A voltage level of a drain voltage pulse applied to the drain region in the erase mode can be the same as a voltage level of the drain voltage pulse in the write mode.

A voltage level of the drain voltage pulse in an enable state can be higher than a voltage level of the drain voltage pulse in a standby state. And in the write mode and the erase mode, a voltage level of the drain voltage pulse in an enable state can be higher than a voltage level of the source voltage pulse in an enable state.

According to another aspect of the inventive concept, there is provided a method of operating at least one semiconductor device comprising a drain region, a source region, a floating body region, and a gate region. The method includes, in an erase mode in which a state of data of the semiconductor device is changed into a first state, transitioning a gate voltage pulse applied to the gate region to a standby state from an enable state and then, transitioning a drain voltage pulse applied to the drain region the standby state from the enable state, and in a write mode in which a state of data of the semiconductor device is changed into a second state, transitioning the drain voltage pulse to the standby state from the enable state and then, transitioning the gate voltage pulse to the standby state from the enable state.

A voltage level of the gate voltage pulse in an enable state can be lower than a voltage level of the gate voltage pulse in a standby state. A voltage level of the drain voltage pulse in an enable state can be lower than a voltage level of the drain voltage pulse in a standby state. And a source voltage applied to the source region can have the same voltage level in the enable state and the standby state.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF THE EMBODIMENTS

Figure 1:
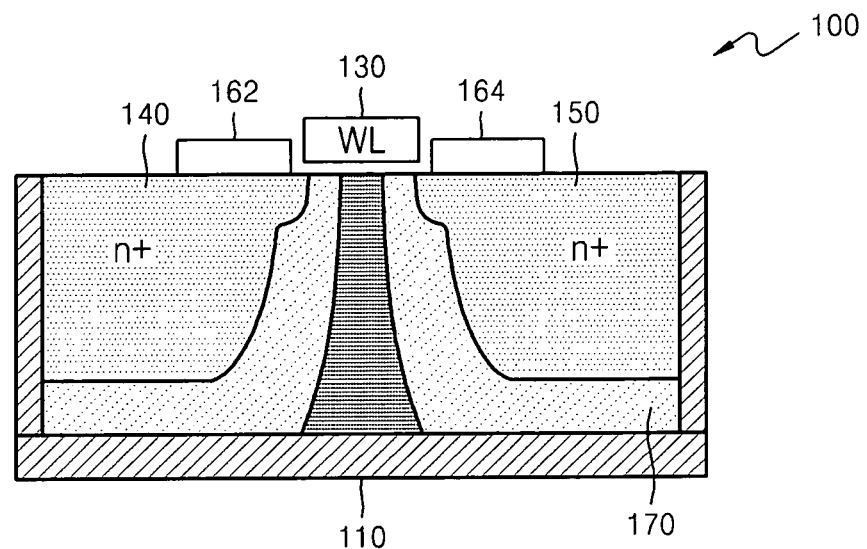
FIG. 1 illustrates an exemplary embodiment of a 1T-DRAM device, according to aspects of the inventive concept.

Hereinafter, exemplary embodiments will be described in detail with reference to the attached drawings, from which the inventive concepts will be evident to those skilled in the art. Like reference numerals in the drawings denote like elements.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

FIG. 1 illustrates an exemplary embodiment of a 1T-DRAM device 100 according to aspects of the inventive concept.

The 1T-DRAM device 100 illustrated in FIG. 1 includes a semiconductor substrate 110, a body region 170, a gate pattern 130, a source electrode 162, a drain electrode 164, a source region 140, and a drain region 150. Each of the source region 140 and the drain region 150 is doped with a predetermined impurity. The positions of the source region 140 and the drain region 150 relative to the gate pattern may be reversed from those shown, and the positions of the source electrode 162 and the drain electrode 164 may be reversed accordingly.

Figure 2:
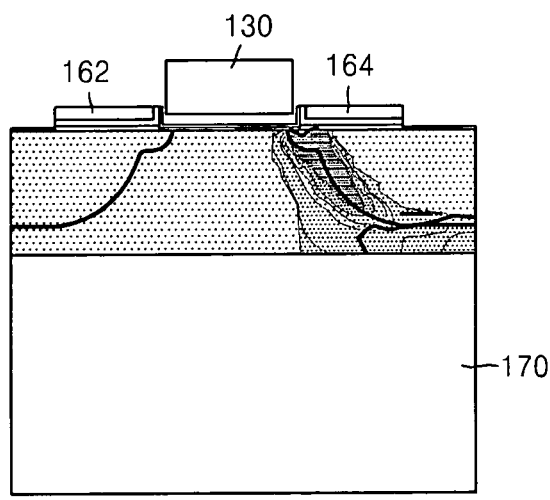
FIG. 2 illustrates a case where carriers are generated in a write mode of the 1T-DRAM device of FIG. 1.
Figure 3:
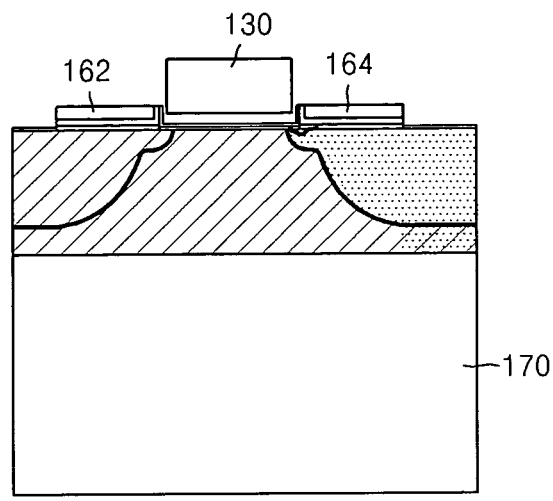
FIG. 3 illustrates a case where carriers are stored after the write mode of the 1T-DRAM device of FIG. 1.
Figure 4:
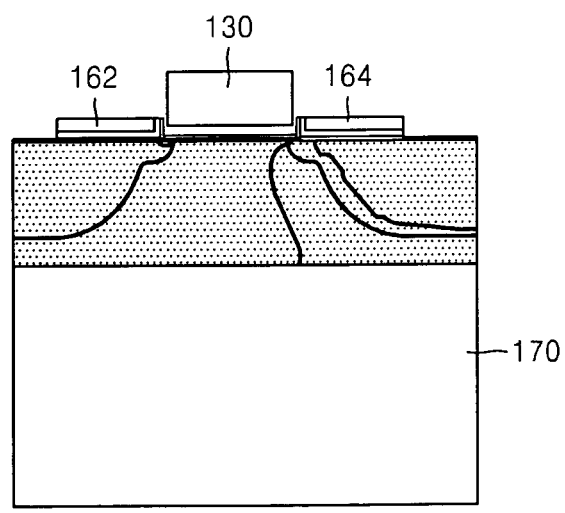
FIG. 4 illustrates a case where carriers are removed in an erase mode of the 1T-DRAM device of FIG. 1.

FIG. 2 illustrates a case where carriers are generated in a write mode of the 1T-DRAM device 100 of FIG. 1. FIG. 3 illustrates a case where carriers are stored after the write mode of the 1T-DRAM device 100 of FIG. 1. FIG. 4 illustrates a case where carriers are removed in an erase mode of the 1T-DRAM device 100 of FIG. 1.

In the write mode, carriers (for example, holes) may be generated due to impact ionization in a portion in which the body region 170 and the drain region 150 contact each other (refer to FIG. 2). The carriers that are generated due to impact ionization, as illustrated in FIG. 2, are stored in the body region 170 (refer to FIG. 3). A concentration of the carriers in a region marked by slant lines in FIG. 3 is higher than a concentration of the carriers in a region marked by dots in FIG. 3. Otherwise, when carriers are not generated in the write mode, the carriers are not stored in the body region 170, as illustrated in FIG. 4. A concentration of the carriers in a region marked by dots, as shown in FIG. 3, is lower than a concentration of the carriers in the region marked by slant lines, as shown in FIG. 3.

When the carriers are stored in the body region 170, data "1" may be written into the 1T-DRAM device 100. Otherwise, when the carriers are not stored in the body region 170, data "0" may be written into the 1T-DRAM device 100.

Also, the carriers stored in the body region 170 may be removed (in an erase mode) such that the body region 170 illustrated in FIG. 4 results.

In a read mode, the amount of current that flows through the drain region 150 from the source region 140 is measured, and data can be read from the 1T-DRAM device 100. When the number of carriers stored in the body region 170 is large, the amount of current that flows through the drain region 150 from the source region 140 is large, and when the number of carriers stored in the body region 170 is small, the amount of current that flows through the drain region 150 from the source region 140 is small.

Levels of a gate voltage, a drain voltage, and a source voltage, which are applied to the gate pattern 130, the drain electrode 162, and the source electrode 164, respectively, are adjusted so that the write mode as shown in FIG. 2 and the erase mode or read mode as shown in FIG. 4 may be performed.

The source region 140 may be connected to a source line, and the drain region 150 may be connected to a bit line. The source voltage may be supplied to the source region 140 through the source line, and the drain voltage may be supplied to the drain region 150 through the bit line. In addition, the gate pattern 130 may be connected to a word line, and the gate voltage may be supplied to the gate pattern 130 through the word line.

Figure 5:
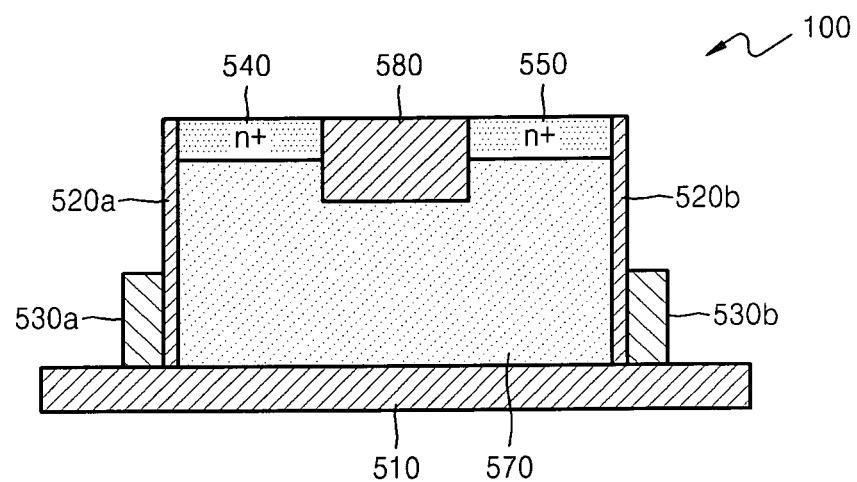
FIG. 5 illustrates another exemplary embodiment of a 1T-DRAM device, according to aspects of the inventive concept.

FIG. 5 illustrates another exemplary embodiment of a 1T-DRAM device 500, according to aspects of the inventive concept.

The 1T-DRAM device 500 illustrated in FIG. 5 includes a semiconductor substrate 510, a body region 570, gate patterns 530a and 530b, a first impurity-doped region 540, and a second impurity-doped region 550.

The body region 570 is positioned on the semiconductor substrate 510. The gate patterns 530a and 530b are positioned on the semiconductor substrate 510 and are disposed at both sides of the body region 570. The first and second impurity-doped regions 540 and 550 are positioned above the body region 570. The first impurity-doped region 540 and the second impurity-doped region 550 may be a drain region (or source region) and a source region (or drain region).

The gate patterns 530a and 530b may be separated from the first and second impurity-doped regions 540 and 550 in a vertical direction by a predetermined distance. Thus, the gate patterns 530a and 530b do not overlap with the first and second impurity-doped regions 540 and 550.

The gate patterns 530a and 530b may be extended to a wide side of the body region 570 in a vertical direction. For example, in FIG. 5, the gate patterns 530a and 530b may be extended in a direction in which the gate patterns 530a and 530b pass through the wide side of the body region 570.

The first impurity-doped region 540 and the second impurity-doped region 550 may be protruded toward a top surface of the body region 570 and may be separated from each other by a predetermined distance. An isolation oxide region 580 may be disposed between the first impurity-doped region 540 and the second impurity-doped region 550.

The isolation oxide region 580 is formed of material including oxide. However, the isolation oxide region 580 may be replaced with an insulating region formed of other insulating materials. In addition, the isolation oxide region 580 of the present exemplary embodiment may be replaced with other insulating regions formed of other insulating materials, apart from the insulating region formed of the other insulating materials.

The 1T-DRAM device 500 of FIG. 5 may further include gate insulating regions 520a and 520b. The gate insulating region 520a is disposed between the gate pattern 530a and the body region 570, and the gate insulating region 520b is disposed between the gate pattern 530b and the body region 570. The gate insulating regions 520a and 520b respectively insulate the gate patterns 530a and 530b from the body region 570.

The 1T-DRAM device 500 of FIG. 5 may further include a buried oxide (BOX) region (not shown) formed in the semiconductor substrate 510. The BOX region is formed by forming an oxide region in a bulk substrate formed as the semiconductor substrate 510, or an insulating region in a silicon-on-insulator (SOI) substrate formed as the semiconductor substrate 510.

Figure 6:
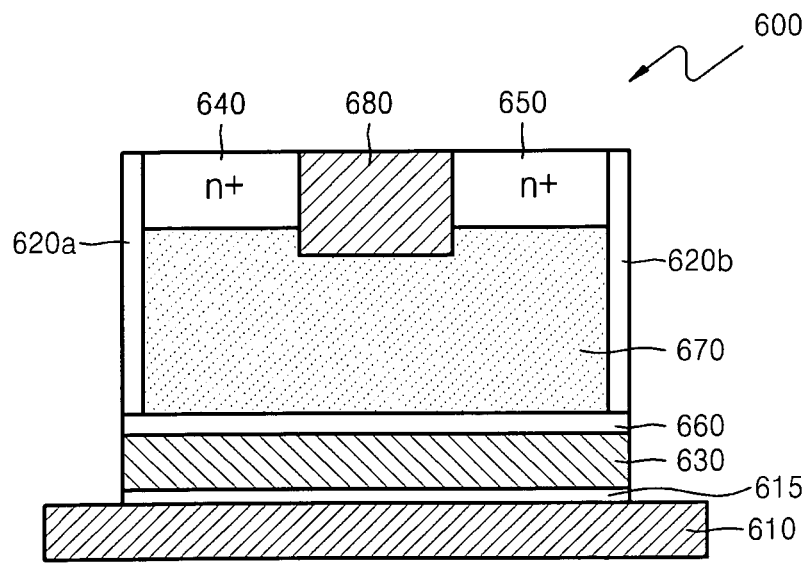
FIG. 6 illustrates another exemplary embodiment of a 1T-DRAM device, according to aspects of the inventive concept.

FIG. 6 illustrates another exemplary embodiment of a 1T-DRAM device 600, according to aspects of the inventive concept.

The 1T-DRAM device 600 illustrated in FIG. 6 includes a semiconductor substrate 610, a gate pattern 630, a body region 670, a first impurity-doped region 640, and a second impurity-doped region 650.

The gate pattern 630 is positioned on the semiconductor substrate 610, and the body region 670 is positioned on the gate pattern 630. The first and second impurity-doped regions 640 and 650 are positioned above the body region 670. In other words, the gate pattern 630 is disposed below the body region 670 and the first and second impurity-doped regions 640 and 650.

The body region 670 may be a floating body region separated from the semiconductor substrate 610. The body region 670 and the semiconductor substrate 610 may be formed of materials having the same electrical properties.

The 1T-DRAM device 600 of FIG. 6 may further include a BOX region 615 formed on the semiconductor substrate 610. The 1T-DRAM device 600 of FIG. 6 may further include insulating regions 620a and 620b. The insulating regions 620a and 620b are disposed on both sides of the gate pattern 630 and at both sides of the body region 670. The insulating regions 620a and 620b insulates the gate pattern 630 and the body region 670 from the surroundings.

An embodiment of a method of operating a semiconductor device according to aspects of the inventive concept will be described next, wherein the semiconductor device used may be any one of the 1-T DRAM devices 100, 500 or 600 described above.

Figure 7:
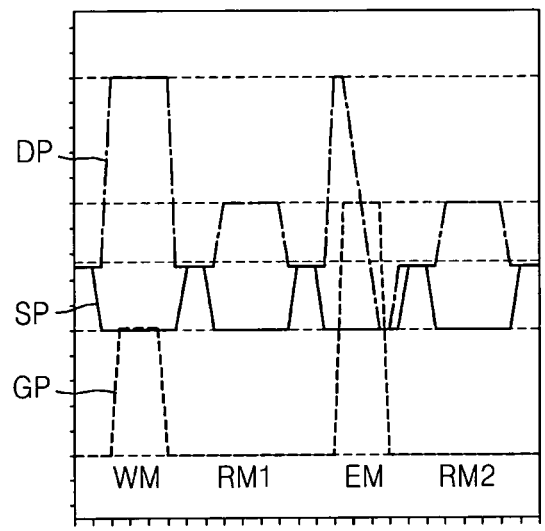
FIG. 7 illustrates an exemplary embodiment of voltage pulses for operating modes of a semiconductor device, according to aspects of the inventive concept.

FIG. 7 illustrates an exemplary embodiment of voltage pulses from operating modes of a semiconductor device, according to aspects of the inventive concept.

Referring to FIG. 7, voltage levels of a gate voltage pulse GP and a drain voltage pulse DP in an enable state are higher than voltage levels of the gate voltage pulse GP and the drain voltage pulse DP in a standby state, and a voltage level of a source voltage pulse SP in an enable state is lower than a voltage level of the source voltage pulse SP in a standby state.

In a write mode WM, the gate voltage pulse GP is transitioned to the standby state from the enable state and then, the drain voltage pulse DP is transitioned to the standby state from the enable state. And in an erase mode EM, the drain voltage pulse DP is transitioned to the standby state from the enable state and then, the gate voltage pulse GP is transitioned to the standby state from the enable state.

In FIG. 7, a voltage level of the drain voltage pulse DP is the same as in the write mode WM and the erase mode EM, but this is just an example and the inventive concept is not limited thereto. In addition, in FIG. 7, a voltage level of the gate voltage pulse GP is different in the write mode WM and in the erase mode EM but this is just an example and the inventive concept is not limited thereto.

A source voltage applied to a source region in the write mode WM and the erase mode EM may be a source voltage pulse SP applied in the form of a regular pulse (refer to FIG. 7), i.e., pulses of substantially the same level and shape. Alternatively, the source voltage may have a predetermined voltage level (for example, a ground voltage level).

FIG. 7 also illustrates voltage pulses applied in a first read mode RM1 that is the next mode after the write mode WM and in a second read mode RM2 that is the next mode after the erase mode EM. In FIG. 7, the write mode WM, the first read mode RM1, the erase mode EM, and the second read mode RM2 are sequentially illustrated; however, this is just an example and the inventive concept is not limited thereto. Thus, a sequence of the write mode WM, the first read mode RM1, the erase mode EM and the second read mode RM2 may be changed. There are 4 modes shown in this embodiment, but a specific mode of the 4 modes may not be performed in all situations or embodiments. For example, only the write mode WM may be performed, or only the erase mode EM may be performed.

Figure 8:
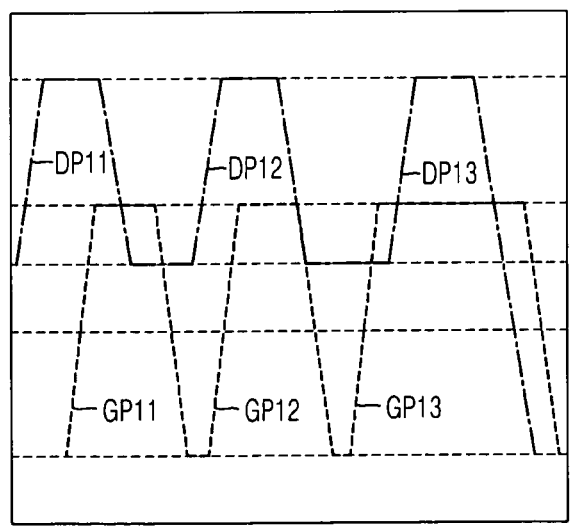
FIG. 8 illustrates an exemplary embodiment of a gate voltage pulse and a drain voltage pulse in an erase mode of a semiconductor device, according to aspects of the inventive concept.

FIG. 8 illustrates an exemplary embodiment of a gate voltage pulse and a drain voltage pulse in an erase mode of a semiconductor device, according to aspects of the inventive concept.

Referring to FIG. 8, in the erase mode, a drain voltage pulse DP11 or DP13 is transitioned to a standby state from an enable state and then, a gate voltage pulse GP11 or GP13 is transitioned to the standby state from the enable state. Alternatively, the transition time of a drain voltage pulse DP12 and the standby transition time of a gate voltage pulse GP12 may be the same.

Meanwhile, an enable time in which the drain voltage pulse DP11 or DP13 and the gate voltage pulse GP11 or GP13 are transitioned to an enable state from a standby state may be changed. For example, an enable time of the drain voltage pulse DP13 may be slower than an enable time of the gate voltage pulse GP13, or an enable time of the drain voltage pulse DP11 or DP12 may be faster than an enable time of the gate voltage pulse GP11 or GP12.

Figure 9:
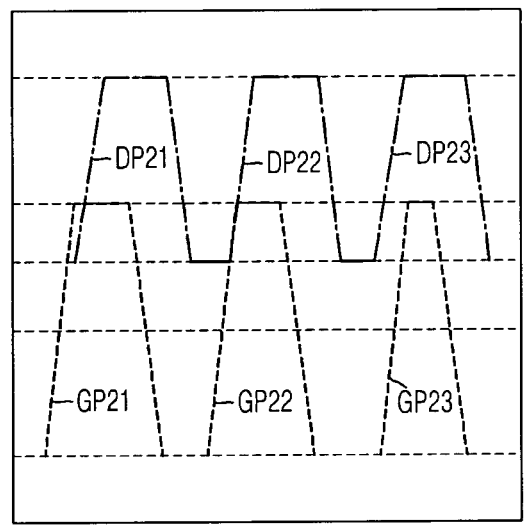
FIG. 9 illustrates exemplary embodiment of a gate voltage pulse and a drain voltage pulse in a write mode of a semiconductor device, according to aspects of the inventive concept.

FIG. 9 illustrates an exemplary embodiment of a gate voltage pulse and a drain voltage pulse in a write mode of a semiconductor device, according to aspects of the inventive concept.

Referring to FIG. 9, in the write mode, a gate voltage pulse GP21, GP22 or GP23 is transitioned to a standby state from an enable state and then, a drain voltage pulse DP21, DP22 or DP23 is transitioned to the standby state from the enable state.

Meanwhile, an enable time in which the drain voltage pulse DP21, DP22 or DP23 and the gate voltage pulse GP21, GP22 or GP23 are transitioned to an enable state from a standby state may be changed. For example, an enable time of the drain voltage pulse DP21 may be slower than an enable time of the gate voltage pulse GP21, or an enable time of the drain voltage pulse DP23 may be faster than an enable time of the gate voltage pulse GP23. Alternatively, an enable time of the drain voltage pulse DP22 may be the same as an enable time of the gate voltage pulse GP23.

Figure 10:
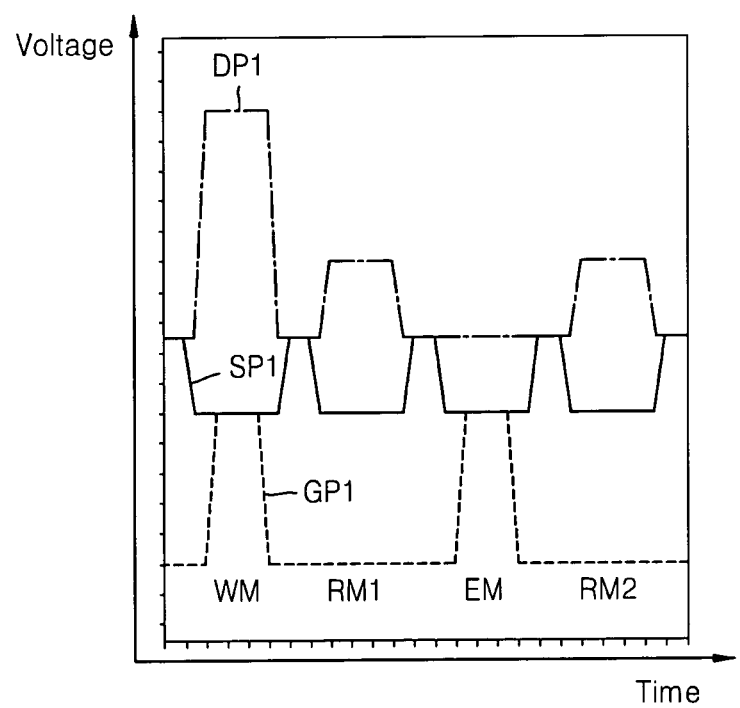
FIGS. 10 through 12 illustrate exemplary embodiments of voltage pulses for operating modes of a semiconductor device, according to aspects of the inventive concept.
Figure 11:
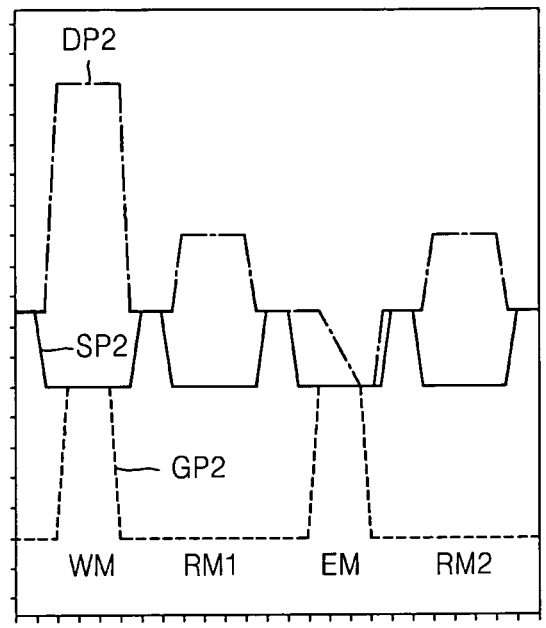
Figure 12:
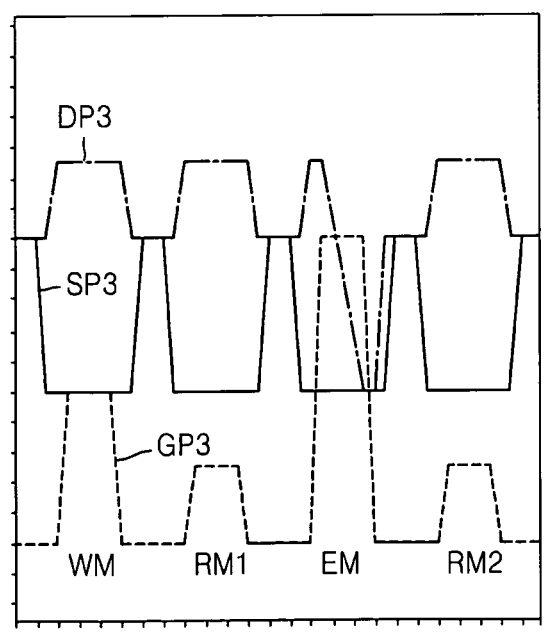

FIGS. 10 through 12 illustrate exemplary embodiments of voltage pulses for operating modes of a semiconductor device, according to aspects of the inventive concept.

The method of operating the semiconductor device of FIG. 10 is different from the method of operating the semiconductor device of FIG. 7 in that, in an erase mode EM, a voltage level of a drain voltage pulse DP1 is constant, and a voltage level of a gate voltage pulse GP1 in the erase mode EM is the same as a voltage level of the gate voltage pulse GP1 in a write mode WM.

The method of operating the semiconductor device of FIG. 11 is different from the method of operating the semiconductor device of FIG. 7 in a form in which the state of the drain voltage pulse DP2 is transitioned in the erase mode EM. In addition, the method of operating the semiconductor device of FIG. 11 is different from the method of operating the semiconductor device of FIG. 7 in that a voltage level of the gate voltage pulse GP1 in the erase mode EM is the same as a voltage level of the gate voltage pulse GP1 in the write mode WM.

The method of operating the semiconductor device of FIG. 12 is different from the method of operating the semiconductor device of FIG. 7 in that, in a write mode WM, a voltage level of a drain voltage pulse DP3 is high.

In the methods of operating the semiconductor device of FIGS. 7 through 12, the amplitude of a gate voltage pulse applied in the erase mode may be the same as the amplitude of a gate voltage pulse applied in the write mode. In addition, the amplitude of the drain voltage pulse applied in the erase mode may be the same as the amplitude of the drain voltage pulse applied in the write mode. In the erase mode and the write mode, a duration time of the gate voltage pulse may be narrower than, the same as, or wider than a duration time of the drain voltage pulse. In addition, the amplitude of the gate voltage pulse and the amplitude of the source voltage pulse may be different from each other.

Figure 13:
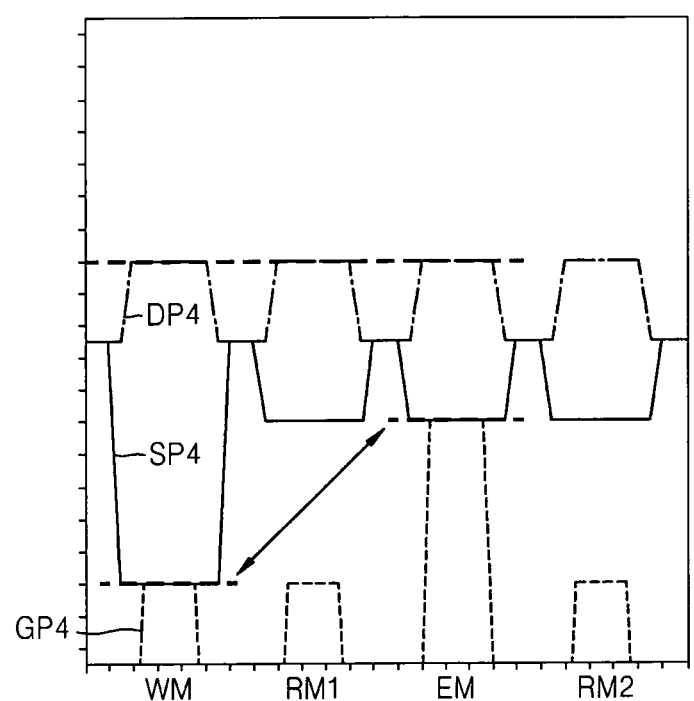
FIG. 13 illustrates an exemplary embodiment of voltage pulses for operating modes of a semiconductor device, according to aspects of the inventive concept.

FIG. 13 illustrates an exemplary embodiment of voltage pulses for operating modes of a semiconductor device, according to aspects of the inventive concept.

Referring to FIG. 13, in the method of operating the semiconductor device according to the current embodiment, a voltage level of a gate voltage pulse GP4 applied to a gate region in an erase mode EM is higher than a voltage level of the gate voltage pulse GP4 in a write mode WM. In addition, a voltage level of a source voltage pulse SP4 applied to a source region in the erase mode EM is higher than a voltage level of the source voltage pulse SP4 in the write mode WM.

In the method of operating the semiconductor device illustrated in FIGS. 7 through 12, a state transition time between the drain voltage pulse DP4 and the gate voltage pulse GP4 is adjusted so that the erase mode EM and the write mode WM are discriminated from each other. However, in the method of operating the semiconductor device illustrated in FIG. 13, voltage levels of the drain voltage pulse DP4, the gate voltage pulse GP4 and the source voltage pulse SP4 are adjusted so that the erase mode EM and the write mode WM are discriminated from each other. In other words, in the method of operating the semiconductor device illustrated in FIG. 13, a transition time between the drain voltage pulse DP4 and the gate voltage pulse GP4 does not matter.

A voltage level of the gate voltage pulse GP4 in an enable state may be higher than a voltage level of the gate voltage pulse GP4 in a standby state. A voltage level of the source voltage pulse SP4 in an enable state may be lower than a voltage level of the source voltage pulse SP4 in a standby state. In the write mode WM and the erase mode EM, a voltage level of the gate voltage pulse GP4 in an enable state may be the same as a voltage level of the source voltage pulse SP4 in an enable state.

In the erase mode EM, a voltage level of the drain voltage pulse DP4 in the erase mode EM may be the same as a voltage level of the drain voltage pulse DP4 in the write mode WM. A voltage level of the drain voltage DP4 in an enable state may be higher than a voltage level of the drain voltage pulse DP4 in a standby state. In the write mode WM and the erase mode EM, a voltage level of the drain voltage pulse DP4 in an enable state may be higher than a voltage level of the source voltage pulse SP4 in an enable state.

As a modification of the method of operating the semiconductor device, as variations of the above embodiments, drain and source voltages having the same magnitude and the same pulse timing are used in the erase mode and the write mode, and the erase mode and the write mode may be discriminated from each other by changing a magnitude of a gate voltage or gate voltage pulse timing.

In the erase mode and the write mode, a voltage level in an enable state may be reduced in a sequence of a drain voltage pulse, a source voltage pulse, and a gate voltage pulse or in a sequence of the drain voltage pulse, the gate voltage pulse, and the source voltage pulse.

In the erase mode and the write mode, a voltage level of the drain voltage pulse in a standby state may be the same as a voltage level of the source voltage pulse in a standby state, and a voltage level of the gate voltage pulse in a standby state may be lower than a voltage level of the source voltage pulse in a standby state.

In the erase mode and the write mode, a voltage level of the gate voltage pulse in an enable state may be higher than a voltage level of the gate voltage pulse in a standby state.

In the enable state and the standby state, a voltage magnitude of each of a drain voltage, a source voltage, and a gate voltage is based on the above condition. However, the method of operating the semiconductor device for a case where a magnitude of the gate voltage in an enable state is smaller than a magnitude of the gate voltage in a standby state, and a case where a magnitude of the drain voltage in an enable state is smaller than a magnitude of the drain voltage in a standby state, and a case where a magnitude of the source voltage in an enable state is the same as a magnitude of the source voltage in a standby state, may be performed as below.

In an erase mode in which a state of data of a semiconductor device is changed into a first state, a gate voltage pulse is transitioned to the standby state from the enable state and then, a drain voltage pulse is transitioned to the standby state from the enable state. In a write mode in which the state of data of the semiconductor device is changed into a second state, the drain voltage pulse applied to the drain region is transitioned to a standby state from an enable state and then, the gate voltage pulse applied to the gate region is transitioned to the standby state from the enable state.

While the inventive concepts have been particularly shown and described with reference to exemplary embodiments, it will be understood that various changes in form and details may be made therein without departing from the spirit and scope of the invention, as described by the following claims.

What is claimed is:

1. A method of operating at least one semiconductor device comprising a drain region, a source region, a floating body region, and a gate region, the method comprising:
   in an erase mode in which a state of data of the semiconductor device is changed into a first state, transitioning a drain voltage pulse applied to the drain region to a standby state from an enable state and then, transitioning a gate voltage pulse applied to the gate region to the standby state from the enable state, and
   in a write mode in which a state of data of the semiconductor device is changed into a second state, transitioning the gate voltage pulse to the standby state from the enable state and then, transitioning the drain voltage pulse to the standby state from the enable state.

2. The method of claim 1, wherein the method further comprises:
in the erase mode, transitioning the drain voltage pulse to the standby state from the enable state and then, transitioning the gate voltage pulse to the standby state from the enable state, wherein a transition time of the drain voltage pulse is the same as a transition time of the gate voltage pulse.

3. The method of claim 1, wherein, in the erase mode and the write mode, a source voltage applied to the source region is one of a source voltage pulse or a voltage that has a predetermined voltage level.

4. The method of claim 1, wherein:
an amplitude of the gate voltage pulse in the erase mode is the same as an amplitude of the gate voltage pulse in the write mode, or
an amplitude of the drain voltage pulse in the erase mode is the same as an amplitude of the drain voltage pulse in the write mode.

5. The method of claim 1, wherein the method can include applying a source voltage to the source region in the form of a source voltage pulse or a source voltage having a predetermined level, and in the erase mode:
an amplitude of the gate voltage pulse is different from an amplitude of the source voltage pulse, or
an amplitude of the gate voltage pulse is different from the predetermined voltage level of the source voltage.

6. The method of claim 1, wherein, in the erase mode and the write mode, a time in which the gate voltage pulse is transitioned to the enable state from the standby state, is faster than or slower than a time in which the drain voltage pulse is transitioned to the enable state from the standby state.

7. The method of claim 1, wherein, in the erase mode and the write mode, a duration time of the gate voltage pulse is narrower than or wider than a duration time of the drain voltage pulse.

8. The method of claim 1, wherein, in the erase mode and the write mode, a voltage level in an enable state is reduced in a sequence of the drain voltage pulse, the source voltage, and the gate voltage pulse or in a sequence of the drain voltage pulse, the gate voltage pulse, and the source voltage.

9. The method of claim 1, wherein, in the erase mode and the write mode, a voltage level of the drain voltage pulse in a standby state is the same as a voltage level of the source voltage, and a voltage level of the gate voltage pulse in a standby state is lower than a voltage level of the source voltage.

10. The method of claim 1, wherein a voltage level of the gate voltage pulse in an enable state is larger than a voltage level of the gate voltage pulse in a standby state.

11. The method of claim 1, wherein the semiconductor device comprises:
a semiconductor substrate;
a body region positioned on the semiconductor substrate;
a plurality of gate patterns positioned on the semiconductor substrate and disposed at both sides of the body region; and
first and second impurity-doped regions positioned above the body region.

12. The method of claim 11, wherein the gate patterns are separated from the first and second impurity-doped regions in a vertical direction by a predeteimined distance so that the gate patterns do not overlap with the first and second impurity-doped regions.

13. The method of claim 1, wherein the semiconductor device comprises:
a semiconductor substrate;
a gate pattern positioned on the semiconductor substrate;
a body region positioned on the gate pattern; and
first and second impurity-doped regions positioned above the body region.

14. A method of operating at least one semiconductor device comprising a drain region, a source region, a floating body region, and a gate region, the method comprising:
applying a voltage level of a gate voltage pulse to the gate region in an erase mode, in which a state of data of the semiconductor device is changed into a first state, that is higher than a voltage level of the gate voltage pulse in a write mode, in which a state of data of the semiconductor device is changed into a second state, and
applying a voltage level of a source voltage pulse to the source region in the erase mode that is higher than a voltage level of the source voltage pulse in the write mode.

15. The method of claim 14, wherein:
a voltage level of the gate voltage pulse in an enable state is higher than a voltage level of the gate voltage pulse in a standby state,
a voltage level of the source voltage pulse in an enable state is lower than a voltage level of the source voltage pulse in a standby state, and
in the erase mode and the write mode, a voltage level of the gate voltage pulse in an enable state is the same as a voltage level of the source voltage pulse in an enable state.

16. The method of claim 15, wherein:
in the write mode, a voltage level of the gate voltage pulse in an enable state and a voltage level of the source voltage pulse in an enable state are lower than a ground voltage level, and
in the erase mode, a voltage level of the gate voltage pulse in an enable state and a voltage level of the source voltage pulse in an enable state are the same as the ground voltage level.

17. The method of claim 14, wherein a voltage level of a drain voltage pulse applied to the drain region in the erase mode is the same as a voltage level of the drain voltage pulse in the write mode.

18. The method of claim 17, wherein:
a voltage level of the drain voltage pulse in an enable state is higher than a voltage level of the drain voltage pulse in a standby state, and
in the write mode and the erase mode, a voltage level of the drain voltage pulse in an enable state is higher than a voltage level of the source voltage pulse in an enable state.

* * * * *